United States Patent
Kim et al.

[11] Patent Number: 5,532,900
[45] Date of Patent: Jul. 2, 1996

[54] SEMICONDUCTOR ARRESTER

[75] Inventors: Min-Su Kim, Kyungki-Do, Rep. of Korea; Itsunari Hamada, Nagano, Japan

[73] Assignee: Shinko Electric Industries Co., Ltd., Nagano, Japan

[21] Appl. No.: 386,907

[22] Filed: Feb. 8, 1995

[30] Foreign Application Priority Data

Feb. 14, 1994 [JP] Japan ................................ 6-019099

[51] Int. Cl.⁶ ................................................ H02H 9/06
[52] U.S. Cl. ........................ 361/127; 361/127; 338/21; 257/726
[58] Field of Search ...................... 361/127, 56; 338/21; 257/925, 723–726

[56] References Cited

U.S. PATENT DOCUMENTS

| | | | |
|---|---|---|---|
| 4,347,543 | 8/1982 | Frister et al. | 361/91 |
| 4,408,248 | 10/1983 | Bulley et al. | 361/91 |
| 4,599,636 | 7/1986 | Roberts et al. | 357/76 |
| 5,175,662 | 12/1992 | DeBalko et al. | |
| 5,218,231 | 6/1993 | Kudo. | |
| 5,272,363 | 12/1993 | Pezzani | 361/56 |

FOREIGN PATENT DOCUMENTS

| | | |
|---|---|---|
| 0278585 | 8/1988 | European Pat. Off. . |
| 0472405 | 2/1992 | European Pat. Off. . |
| 0518790 | 12/1992 | European Pat. Off. . |

Primary Examiner—Todd DeBoer
Attorney, Agent, or Firm—Pennie & Edmonds

[57] ABSTRACT

To enable the mounting of arrester in a small-sized package of a resin-sealed type for general use, such as a T0-92 package or a T0-220 package, by modifying the arrangement of diodes and thyristor there is provided: a diode-bridge thyristor type of semiconductor arrester, comprising: a pair of opposed metal plates (20, 21); a thyristor (T1) between the metal plates (20, 21); three pairs of diodes (D1, D2: D3, D4: D5, D6) between the metal plates (20, 21); and three leads (22, 23, 24), each provided between each pair of diodes.

8 Claims, 5 Drawing Sheets

SEMICONDUCTOR ARRESTER

BACKGROUND OF THE INVENTION

1. Field of the Invention

The present invention relates to a semiconductor arrester which is a safety device for protecting a communication instrument or the like from an abnormally high voltage caused by lightning, contact with a power cable, or short-circuit or failure in the communication instrument. Particularly, it relates to a semiconductor arrester of diode-bridge thyristor type.

2. Description of the Related Art

FIG. 9 shows the circuitry of a semiconductor arrester of diode-bridge thyristor type (hereinafter referred to as "a semiconductor arrester"), having three terminals (T; tip, E; earth, R; ring), six diodes (D1 to D6) and one reverse-blocking diode thyristor (T1), wherein an anode of D1 and a cathode of D2 are connected with terminal T (or terminal R); an anode of D6 and a cathode of D5 are connected with terminal E; cathodes of D1, D3 and D6 are connected with an anode of T1 and anodes of D2, D4 and D5 are connected with a cathode of T1.

In such a circuit structure, if it is assumed that an abnormally high voltage of positive polarity is applied, for example, to terminal T, then D1, T1 and D5 are sequentially biased in the forward direction and T1 is turned on to connect terminal T to terminal E via a low resistance. Accordingly, the abnormally high voltage can be released to terminal E (earth) so that the communication instrument connected to terminal T is protected.

FIG. 10 shows a package structure for the conventional semiconductor arrester, seen from above when a cap is removed, wherein the first to the sixth metallic members 11 through 16 are mounted on an insulating base plate 10.

The first, second, fifth and the sixth metallic members 11, 12, 15 and 16 all penetrate the insulation base plate 10 from the front side to the back side thereof. The first metallic member 11 exposed on the back side of the insulation base plate 10 is used as terminal T (or terminal R), and the second metallic member 12 on the back side is as terminal R (or terminal T). Also, the fifth metallic member 15 and the sixth metallic member 16 on the back side are both used as terminal E or one of them is as terminal E while being connected with the other.

The first metallic member 11 on the front side of the insulation base plate 10 is used as anode contact of D1 and cathode contact of D2; the second metallic member 12 on the front side is as anode contact of D3 and cathode contact of D4; the fifth metallic member 15 on the front side is as cathode contact of D5; and the sixth metallic member 16 on the front side is as anode contact of D6.

Further, the third metallic member 13 is used as anode contacts of D2, D4 and D5 as well as cathode contact of T1; and the fourth metallic member 14 is as cathode contacts of D1, D3 and D6 as well as anode contact of T1.

In the conventional package structure of semiconductor arrester described above, since the elements were actually arranged in the circuitry as they are illustrated in FIG. 9, there is a problem in that, for example, D5, T1 and D6 are located in one row to require a longer space, and the thyristor and the diodes are not base chips, but are thickly covered, whereby they can be installed only in a relatively large package.

SUMMARY OF THE INVENTION

The primary object of the present invention is to provide a semiconductor arrester capable of being installed in a small-sized package of a resin-sealed type for general use, such as a T0-92 package or a T0-220 package, wherein the arrangement of diodes and thyristor are designed to be compact.

To achieve the above object, a diode-bridge thyristor type of semiconductor arrester is provided, according to the present invention, comprising: a pair of opposed metal plates; a thyristor between the metal plates; three pairs of diodes between the metal plates; and three leads, each provided between each pair of the diodes.

With this arrangement, the thyristor is solely sandwiched between the metal plates. Therefore, the thyristor and the two diodes are not arranged in one row as is the conventional case. Thus, the package size can be reduced by at least an extent corresponding to the thickness of the thyristor, whereby the inventive arrester is capable of being accommodated in a small-sized package of a resin-sealed type for the general use such as a T0-92 package or a T0-220 package.

BRIEF DESCRIPTION OF THE INVENTION

These and other objects and features of the present invention will become apparent from the following detailed description of the preferred embodiment, in connection with the attached drawings.

DETAILED DESCRIPTION OF THE INVENTION

Figure 1:
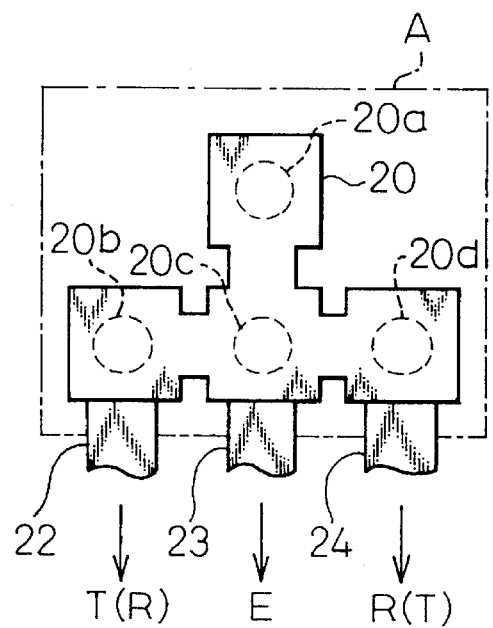
FIG. 1 is a front view of one embodiment of a semiconductor arrester according to the present invention.

Each of a first metallic plate 20 and a second metallic plate 21 is equally formed into generally T-shape and has three ends and one cross-point, on which are provided, respectively, contacts 20a to 20d in the case of the first metallic plate 20 or contacts 21a to 21d in the case of the second metallic plate 21.

The first and second metallic plates 20, 21 are located so that the contacts of the one plate are opposite to those of the other plate. Between the pair of contacts 20a and 21a is fixedly sandwiched a reverse-blocking diode thyristor T1 (see FIG. 9) by soldering.

Also, between the remaining three pairs of contacts 20b, 21b; 20c, 21c; and 20d, 21d are intervened a first lead 22 (terminal T or R), a second lead 23 (terminal E) and third lead 24 (terminal R or T), respectively, in a non-contacting state. Between the leads 22, 23, 24 and the contacts 20b, 21b, 20c, 21c, 20d, 21d, except for the pair of contacts 20a, 21a, are fixedly sandwiched diodes D1 through D6 (see FIG. 9), respectively, by soldering.

Concretely, D1 is sandwiched between one side of the first lead 22 and the contact 20b; D2 is between the other side of the first lead 22 and the contact 21b; D6 is between one side of the second lead 23 and the contact 20c; D5 is between the other side of the second lead 23 and the contact 21c; D3 is between one side of the third lead 24 and the contact 20d; and D4 is between the other side of the third lead 24 and the contact 21d, respectively.

Polarities of T1, D1 through D6 are listed in the following table:

TABLE

| Element | Partner of Anode | Partner of Cathode |
|---------|------------------|---------------------|
| T1 | contact 20a | contact 21a |
| D1 | first lead 22 | contact 20b |
| D2 | contact 21b | first lead 22 |
| D3 | third lead 24 | contact 20d |
| D4 | contact 21d | third lead 24 |
| D5 | contact 21c | second lead 23 |
| D6 | second lead 23 | contact 20c |

Figure 9:
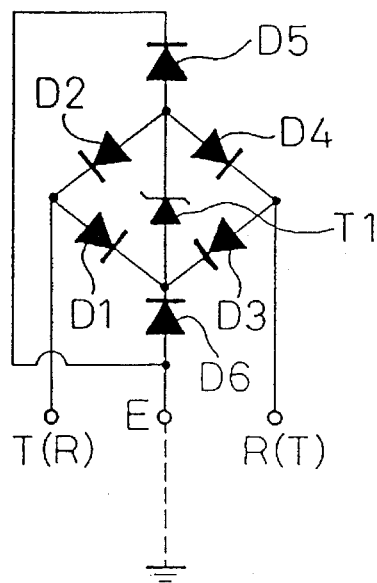
FIG. 9 is the circuitry of a semiconductor arrester of diode-bridge thyristor type.
Figure 10:
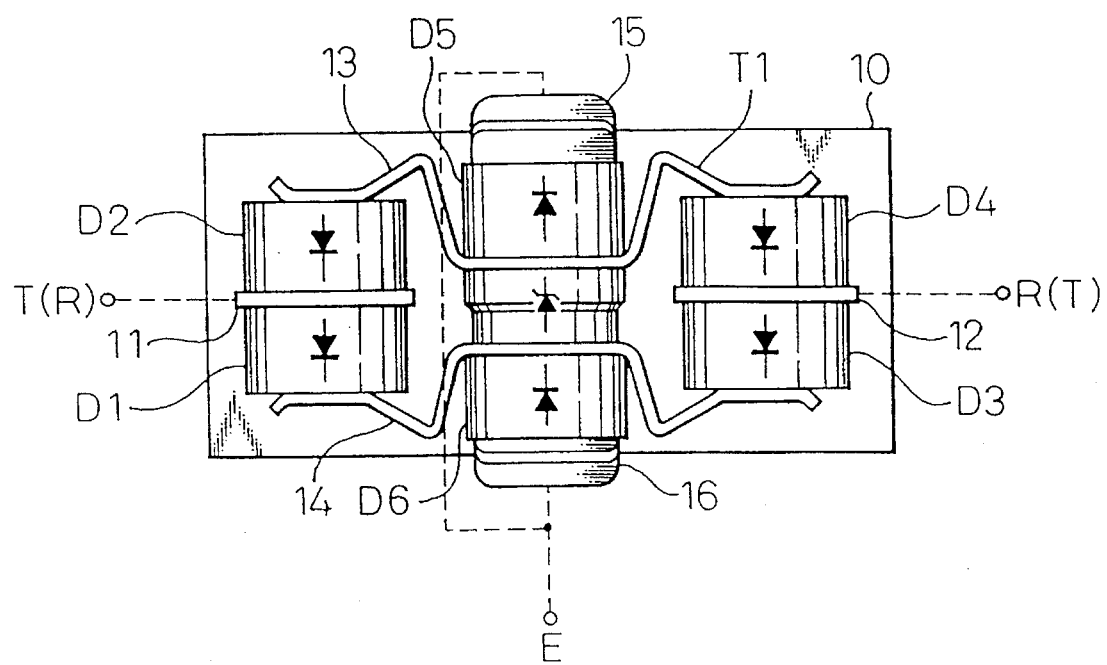
FIG. 10 is the top view of a conventional structure.

According to such a structure, it is possible to arrange D1, T1 and D5 (or D6, T1 and D2) between the first lead 22 (terminal T or R) and the second lead 23 (terminal E) and to arrange D3, T1 and D5 (or D6, T1 and D4) between the third lead 24 (terminal R or T) and the second lead 23 (terminal E), in the forward direction, whereby the circuit shown in FIG. 9 is obtainable.

Moveover, since T1 is solely sandwiched between the first metallic plate 20 and the second metallic plate 21 in this embodiment, it is possible to shorten the distance between the plates 20 and 21 by at least an extent corresponding to the thickness of T1, compared with the conventional device described at the beginning of this specification.

Figure 4:
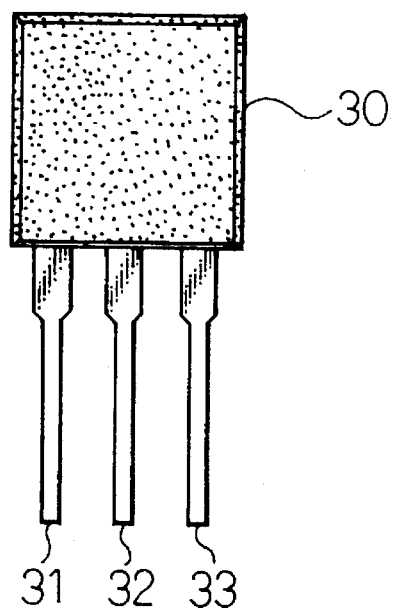
FIG. 4 is a front view of one type of compact package, according to the present invention.
Figure 5:
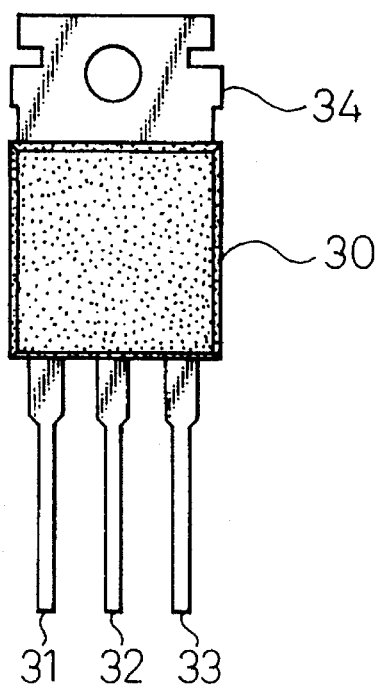
FIG. 5 is a front view of another type of compact package.

Accordingly, a total size of the arrester can be reduced to reduce the package contour (shown by the dotted line A), whereby the arrester can be mounted in a small-sized package for general use, such as the T0-92 package shown in FIG. 4 or the T0-220 package shown in FIG. 5.

Figure 2:
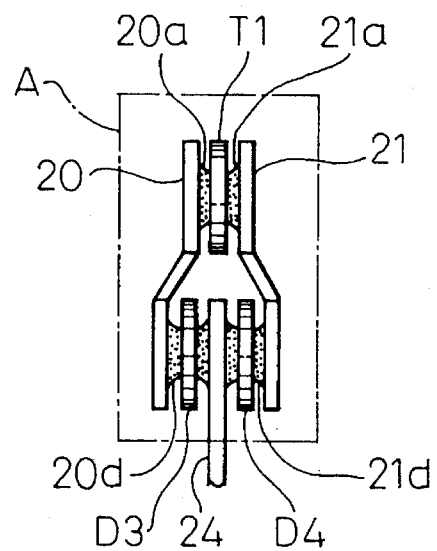
FIG. 2 is a side view of the semiconductor arrester shown in FIG. 1.
Figure 3:
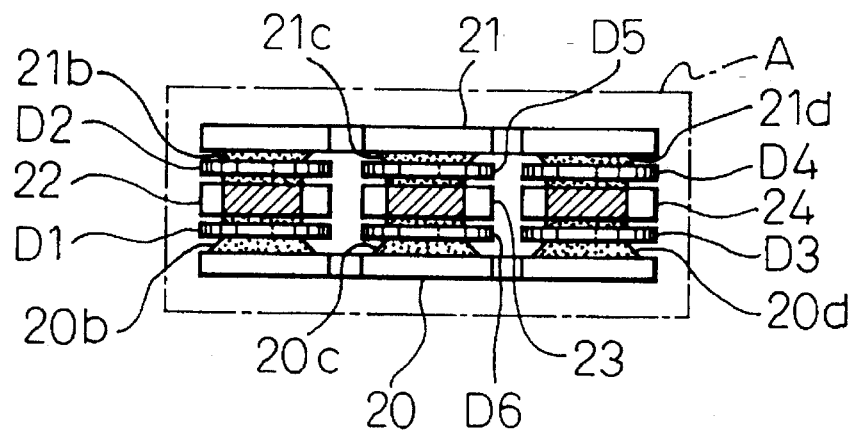
FIG. 3 is a bottom view of the semiconductor arrester.

In this connection, T0-92 and T0-220 packages are defined by JEDEC (Joint Electron Devices Engineering Council) standard, and are mainly used for sealing power source regulator IC or the like. In either cases, three leads 31 through 33 extend outside from a body molded (sealed) by a sealing resin 30 such as plastic. These leads 31 through 33 correspond to the parts of the first lead 22, the second lead 23 and the third lead 24 shown in FIGS. 1–3 (that is, the terminal portions to be connected with outside) except for the end portions thereof to be connected with diodes D1 through D6.

The difference between a T0-220 type package and a T0-92 type package is that the former is provided with a mounting 34 which can also be used as a heat sink.

Figure 6:
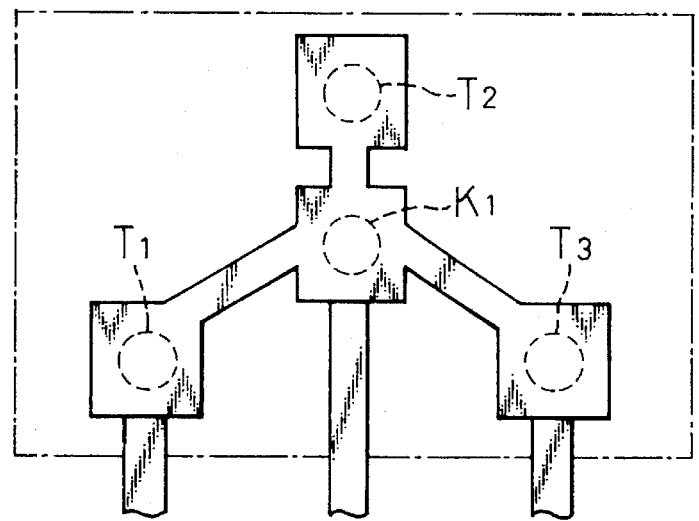
FIG. 6 is a front view of one modification of the plates.
Figure 7:
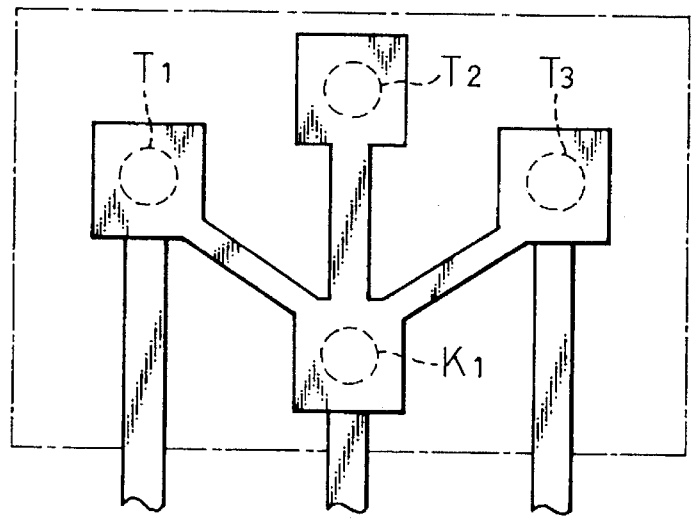
FIG. 7 is a front view of another modification of the plates.
Figure 8:
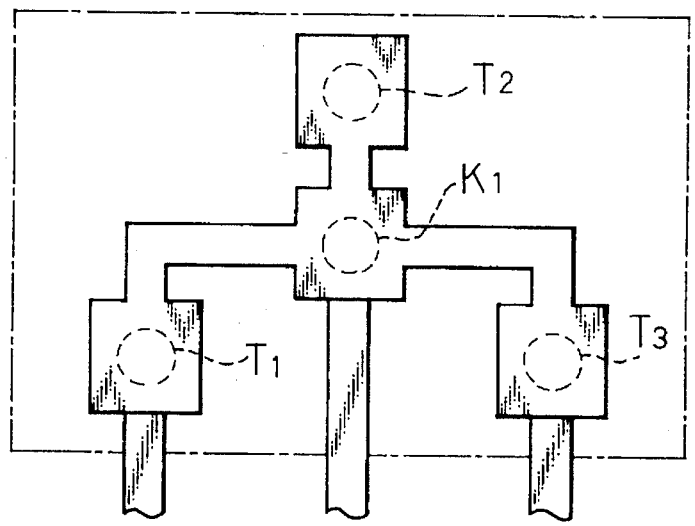
FIG. 8 is a front view of yet another modification of the plates.

In the above embodiment, while the first and second metallic plates are formed into a T-shape, the present invention is not limited thereto. For example, the metallic plate may be of a Y-shape (directed downward) as shown in FIG. 6, an arrow shape as shown in FIG. 7, or a modified T-shape as shown in FIG. 8. In short, any shape may be used if three ends $T_1$, $T_2$ and $T_3$ and one cross-point $K_1$ are provided.

Since a thyristor is sandwiched between only the first and the second metallic plates in the present invention, it is possible to minimize the package size by at least an extent corresponding to the thickness of thyristor, as compared to a conventional package, whereby the arrester can be mounted in a small-sized package of a resin-sealed type for general use such as a T0-92 package or a T0-220 package.

It is to be understood that the present invention is by no means limited to the specific embodiments as illustrated and described herein, and that various modifications, which come within the scope of the present invention as defined in the appended claims, may be made.

We claim:

1. A diode-bridge thyristor containing semiconductor arrestor, comprising;

a pair of opposed metal plates (20, 21) each having four contacts, wherein the four contacts (20a–20d) of one plate (20) are opposite to the four contacts (21a–21d) of the other plate (21);

a thyristor (T) connected between one contact (20a) of one plate (20) and one opposed contact (21a) of the other plate (21);

three pairs of diodes (D1, D2; D3, D4; D5, D6) with each pair respectively connected between the three remaining contacts (20b, 20c, 20d) of one plate (20) and the three remaining contacts (21b, 21c, 21d) of the other plate (21); and a lead (22, 24, 23) provided and intervening between each pair of the diodes (D1, D2; D3, D4; D5, D6).

2. A semiconductor arrester according to claim 1, wherein each diode is naked so as to be directly connected to the associated plate and the associated lead.

3. A semiconductor arrester according to claim 2, wherein the thyristor is naked so as to be directly connected to the metal plates.

4. A semiconductor arrester according to claim 1, wherein there is provided a resin layer filled in the space between the plates.

5. A semiconductor arrester according to claim 1, wherein there is provided a resin molded body in which the plates are entirely embedded.

6. The semiconductor arrestor according to claim 1, wherein the plates are formed into generally T-shape, Y-shape, or arrow shape, each of which includes three ends (T1, T2, T3) and one cross-point (K1) which correspond to the four contacts (20a–20d or 21a–21d).

7. The semiconductor arrestor according to claim 1, wherein the thyristor and two of the diodes are not arranged in a single row.

8. A diode-bridge thyristor containing semiconductor arrestor, comprising:

a pair of opposed metal plates (20, 21) each having four contacts, wherein the four contacts (20a–20d) of one plate (20) are opposite to the four contacts (21a–21d) of the other plate (21);

a thyristor (T) connected between one contact (20a) of one plate (20) and one opposed contact (21a) of the other plate (21);

three pairs of diodes (D1, D2; D3, D4; D5, D6) with each pair respectively connected between the three remaining contacts (20b, 20c, 20d) of one plate (20) and the three remaining contacts (21b, 21c, 21d) of the other plate (21);

a molded resin body; and a lead (22, 24, 23) provided and intervening between each pair of the diodes D1, D2; D3, D4; D5, D6), wherein each diode is naked so as to be directly connected to its associated plate and lead, wherein the thyristor is naked so as to be directly connected to the metal plates and wherein the metal plates are entirely embedded in the resin molded body.

* * * * *